United States Patent
Gaska et al.

(10) Patent No.: US 7,326,963 B2
(45) Date of Patent: Feb. 5, 2008

(54) NITRIDE-BASED LIGHT EMITTING HETEROSTRUCTURE

(75) Inventors: Remigijus Gaska, Columbia, SC (US); Jianping Zhang, Lexington, SC (US); Michael Shur, Latham, NY (US)

(73) Assignee: Sensor Electronic Technology, Inc., Columbia, SC (US)

(*) Notice: Subject to any disclaimer, the term of this patent is extended or adjusted under 35 U.S.C. 154(b) by 0 days.

(21) Appl. No.: 11/292,519

(22) Filed: Dec. 2, 2005

(65) Prior Publication Data

US 2006/0118820 A1 Jun. 8, 2006

Related U.S. Application Data

(60) Provisional application No. 60/633,828, filed on Dec. 6, 2004.

(51) Int. Cl.
*H01L 27/15* (2006.01)
(52) U.S. Cl. ............... 257/79; 257/85; 257/94
(58) Field of Classification Search ............ 257/79
See application file for complete search history.

(56) References Cited

U.S. PATENT DOCUMENTS

| 2004/0099869 | A1* | 5/2004 | Gaska et al. ............... | 257/79 |
| 2005/0263780 | A1* | 12/2005 | Bour et al. ................ | 257/94 |
| 2006/0054902 | A1* | 3/2006 | Johnson ..................... | 257/84 |

FOREIGN PATENT DOCUMENTS

JP 027328 * 11/1996

OTHER PUBLICATIONS

Saxler, A. et al., "Aluminum gallium nitride short-period superlattices doped with magnesium," Applied Physics Letters, vol. 74, No. 14, Apr. 5, 1999, pp. 2023-2025.
Peng, H. et al., "Ultraviolet light-emitting diodes operating in the 340 nm wavelength range and application to time-resolved fluorescence spectroscopy," Applied Physics Letters, vol. 85, No. 8, Aug. 23, 2004, pp. 1436-1438.
Goepfert, I.D., et al., "Experimental and theoretical study of acceptor activation and transport properties in p-type $Al_xGa_{1-x}N$/GaN superlattices," Journal of Applied Physics, vol. 88, No. 4, Aug. 15, 2000, pp. 2030-2038.

(Continued)

*Primary Examiner*—Long Pham
(74) *Attorney, Agent, or Firm*—Hoffman, Warnlick & D'Alessandro, LLC

(57) ABSTRACT

An improved nitride-based light emitting heterostructure is provided. The nitride-based light emitting heterostructure includes an electron supply layer and a hole supply layer with a light generating structure disposed there between. The light generating structure includes a set of barrier layers, each of which has a graded composition and a set of quantum wells, each of which adjoins at least one barrier layer. Additional features, such as a thickness of each quantum well, can be selected/incorporated into the heterostructure to improve one or more of its characteristics. Further, one or more additional layers that include a graded composition can be included in the heterostructure outside of the light generating structure. The graded composition layer(s) cause electrons to lose energy prior to entering a quantum well in the light generating structure, which enables the electrons to recombine with holes more efficiently in the quantum well.

21 Claims, 6 Drawing Sheets

OTHER PUBLICATIONS

Wang, T. et al., "1 mW AllnGaN-based ultraviolet light-emitting diode with an emission wavelength of 348 nm grown on sapphire substrate," Applied Physics Letters, vol. 81, No. 14, Sep. 30, 2002, pp. 2508-2510.

Nishida, Toshio et al., "Efficient and high-power AlGaN-based ultraviolet light-emitting diode grown on bulk GaN," Applied Physics Letters, vol. 79, No. 6, Aug. 6, 2001, pp. 711-712.

Kozodoy, Peter et al., "Polarization-enhanced Mg doping of AlGaN/GaN superlattices," Applied Physics Letters, vol. 75, No. 16, Oct. 18, 1999, pp. 2444-2446.

Shur, M.S. et al., "Accumulation hole layer in p-GaN/AlGaN heterostructures," Applied Physics Letters, vol. 76, No. 21, May 22, 2000, pp. 3061-3063.

Zhang, J.P. et al. "Milliwatt power deep ultraviolet light-emitting diodes over sapphire with emission at 278 nm," Applied Physics Letters, vol. 81, No. 26, Dec. 23, 2002, pp. 4910-4912.

Zhang, J.P. et al., "AlGaN multiple-quantum-well-based, deep ultraviolet light-emitting diodes with significantly reduced long-wave emission," Applied Physics Letters, vol. 83, No. 17, Oct. 27, 2003, pp. 3456-3458.

Chitnis, A. et al., "Improved performance of 325-nm emission AlGaN ultraviolet light-emitting diodes," Applied Physics Letters, vol. 82, No. 16, Apr. 21, 2003, pp. 2565-2567.

Sun, W.H. et al., "AlGaN-based 280 nm light-emitting diodes with continuous wave powers in excess of 1.5 mW," Applied Physics Letters, vol. 85, No. 4, Jul. 26, 2004, pp. 531-533.

Adivarahan, V. et al., "High-efficiency 269 nm emission deep ultraviolet light-emitting diodes," Applied Physics Letters, vol. 84, No. 23, Jun. 7, 2004, pp. 4762-4764.

Yasan, A. et al., "4.5 mW operation of AlGaN-based 267 nm deep-ultraviolet light-emitting diodes," Applied Physics Letters, vol. 83, No. 23, Dec. 8, 2003, pp. 4701-4703.

Fischer, A.J. et al., "Room-temperature direct current operation of 290 nm light-emitting diodes with milliwatt power levels," Applied Physics Letters, vol. 84, No. 17, Apr. 26, 2004, pp. 3394-3396.

Tamulaitis, G. et al., "Dislocation-limited Lifetime of Nonequilibrium Carriers in AlGaN Epilayers," Proceedings of ICPS-27 (2004), pp. 1-2 in copy provided.

Kamiyama, S. et al., "Heteroexpitaxial technology for high-efficiency UV light-emitting diode," Opto-Electronics Review, 10, No. 4, 2002, pp. 225-230.

Zhang, J.P. et al., "AlGaN Based 280 nm Light Emitting Diodes with Continuous-Wave Power Exceeding 1 mW at 25 mA," Applied Physics Letters, vol. 85, No. 23, Dec. 2004, p. 5532 (pp. 1-11 in copy provided).

* cited by examiner

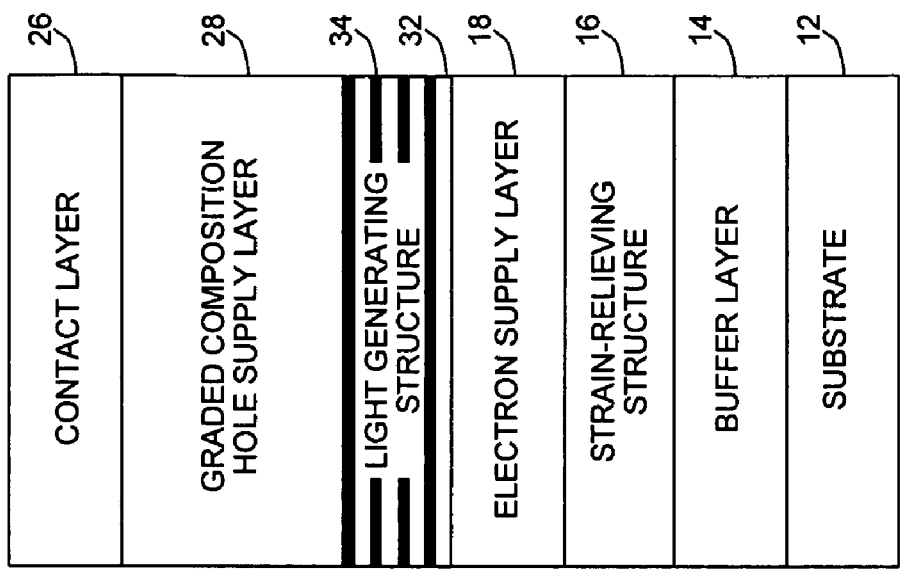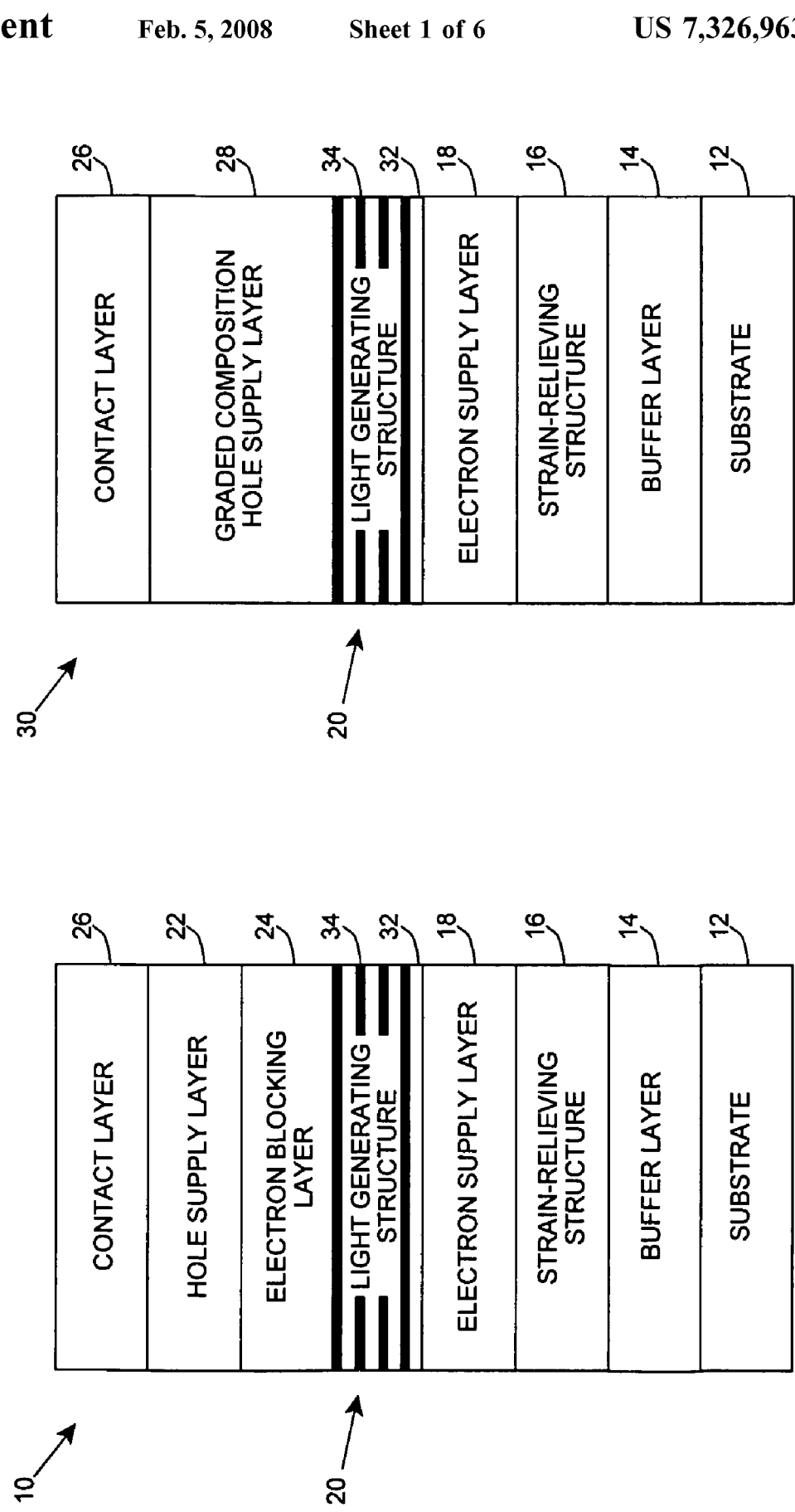

NITRIDE-BASED LIGHT EMITTING HETEROSTRUCTURE

REFERENCE TO PRIOR APPLICATION

The current application claims the benefit of U.S. Provisional Application No. 60/633,828, entitled "Light Emitting Heterostructure", which was filed on Dec. 6, 2004, and which is hereby incorporated herein by reference.

FIELD OF THE INVENTION

The invention relates generally to nitride-based heterostructures, and more particularly, to an improved nitride-based light emitting heterostructure.

BACKGROUND OF THE INVENTION

Recently, a great deal of interest is focused on nitride-based light emitting diodes and lasers that emit light in the blue and deep ultraviolet (UV) wavelengths. These devices may be capable of being incorporated into various applications, including solid-state lighting, biochemical detection, high-density data storage, and the like. However, to date, the performance of nitride-based light emitting diodes and lasers quickly worsens as the radiation wavelength is reduced into the ultraviolet range.

A modern light emitting diode (LED) consists of three major components: an electron supply layer (e.g., an n-type semiconductor) and a hole supply layer (e.g., a p-type semiconductor), with a light generating structure between them. The relatively poor efficiency with which light generated by the light generating structure is a significant barrier to improving the performance of the device in generating light having the shorter wavelengths. Such efficiency is limited by a large difference between the mobilities of electrons and holes. Since electrons are more mobile than holes, the electrons travel more quickly than holes.

To address this situation, some approaches incorporate an electron blocking layer between the light generating structure and a p-type contact layer. The electron blocking layer slows down electrons and allows for a more efficient radiative recombination. However, the electron blocking layer also increases the series resistance of the device and, to a certain extent, provides a barrier for holes as well. Many approaches incorporate multiple quantum wells into the light generating structure to increase the concentration of electron-hole pairs. However, these approaches still fail to provide a solution that efficiently generates light in the shorter wavelengths. Since an amount of nonradiative recombination of electrons and holes is determined by dislocations, many approaches seek to improve the quality of the materials used in the device. Nevertheless, the efficiency of deep UV LEDs remains low.

Another difficulty in developing a UV LED is a deficient hole injection. To date, Magnesium (Mg) is the most successful acceptor, and is therefore commonly used for p-type Gallium (Ga) Nitride (N) layers. The room-temperature activation energy for such a layer can be as high as two-hundred fifty milli-electron Volts (meV), and increases roughly linearly with the Aluminum (Al) molar fraction in AlGaN alloys. However, a large acceptor activation energy results in a deficient hole injection. This is particularly true for a deeper UV LED, in which a higher Al molar fraction is required.

Various approaches seek to enhance the conductivity for a p-type Mg-doped AlGaN layer. In one approach, a Mg-doped AlGaN/GaN short period superlattice (SPSL), such as a Mg-doped AlGaN/GaN SPSL in 340-350 nm UV LED growth, in place of the layer. In this case, a period of the superlattice is sufficiently small (e.g., below four nanometers) so that the effect of the polarization fields on the minibands in the SPSL is negligible. As a result, a vertical conduction of the p-type SPSL is not degraded by the polarization fields.

Another approach uses a Mg-doped AlGaN/GaN large period superlattice (LPSL). In this case, with a period larger than fifteen nm, a valence band discontinuity and the polarization fields can enhance the ionization of the acceptors in the AlGaN barriers and transfer holes into GaN wells. However, the large period inhibits the wavefunction coupling between neighboring wells, which greatly reduces the vertical conductivity. As a result, this LPSL approach can only enhance lateral horizontal p-conductivity. To date, no known approach has successfully used a p-type LPSL for a deep UV LED.

Yet another approach uses a p-GaN/p-AlGaN single heterostructure to accumulate holes at the interface. The mechanism of this approach is similar to the LPSL approach. However, since the p-GaN/p-AlGaN single heterostructure only includes one barrier for hole transportation, the vertical conductivity can be greatly enhanced due to the high-density hole accumulation at the interface and the field assisted tunneling as well as thermal emission. Several UV LEDs have been proposed that incorporate this approach, and have achieved reasonably good output powers. However, it remains desirable to improve the output power and/or efficiency of UV LEDs.

In view of the foregoing, there exists a need in the art to overcome one or more of the deficiencies indicated herein.

BRIEF SUMMARY OF THE INVENTION

The invention provides an improved nitride-based light emitting heterostructure. The nitride-based light emitting heterostructure includes an electron supply layer and a hole supply layer with a light generating structure disposed there between. The light generating structure includes a set of barrier layers, each of which has a graded composition and a set of quantum wells, each of which adjoins at least one barrier layer. Additional features, such as a thickness of each quantum well, can be selected/incorporated into the heterostructure to improve one or more of its characteristics. Further, one or more additional layers that include a graded composition can be included in the heterostructure outside of the light generating structure. The graded composition layer(s) cause electrons to lose energy prior to entering a quantum well in the light generating structure, which enables the electrons to recombine with holes more efficiently in the quantum well.

A first aspect of the invention provides a nitride-based light emitting heterostructure comprising: an electron supply layer; a hole supply layer; and a light generating structure disposed between the electron supply layer and the hole supply layer, the light generating structure including: a set of barrier layers, each barrier layer comprising a graded composition; and a set of quantum wells, each quantum well adjoined by a barrier layer and having a thickness less than a characteristic radius of at least one defect responsible for nonradiative recombination.

A second aspect of the invention provides a nitride-based light emitting device comprising: a substrate; a buffer layer on the substrate; a strain-relieving structure over the buffer layer; an electron supply layer over the strain-relieving structure; a hole supply layer; and a light generating structure disposed between the electron supply layer and the hole supply layer, the light generating structure including: a set of barrier layers, each barrier layer comprising a graded composition; and a set of quantum wells, each quantum well adjoined by a barrier layer and having a thickness less than a characteristic radius of at least one defect responsible for nonradiative recombination.

A third aspect of the invention provides a method of generating a nitride-based light emitting heterostructure, the method comprising: obtaining a substrate; forming an electron supply layer over the substrate; forming a light generating structure over the electron supply layer, the forming a light generating structure including: forming a set of barrier layers, each barrier layer comprising a graded composition; and forming a set of quantum wells, each quantum well adjoined by a barrier layer and having a thickness less than a characteristic radius of at least one defect responsible for nonradiative recombination; and forming a hole supply layer over the light generating structure.

A fourth aspect of the invention provides a method of generating a nitride-based light emitting device, the method comprising: obtaining a substrate; forming an electron supply layer over the substrate; forming a light generating structure over the electron supply layer, the forming a light generating structure including: forming a set of barrier layers, each barrier layer comprising a graded composition; and forming a set of quantum wells, each quantum well adjoined by a barrier layer and having a thickness less than a characteristic radius of at least one defect responsible for nonradiative recombination; and forming a hole supply layer over the light generating structure.

The illustrative aspects of the present invention are designed to solve the problems herein described and other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention, in which:

FIG. 1 shows an illustrative nitride-based light emitting heterostructure according to an embodiment of the invention.

FIG. 2 shows an alternative nitride-based light emitting heterostructure according to an embodiment of the invention.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 3A:
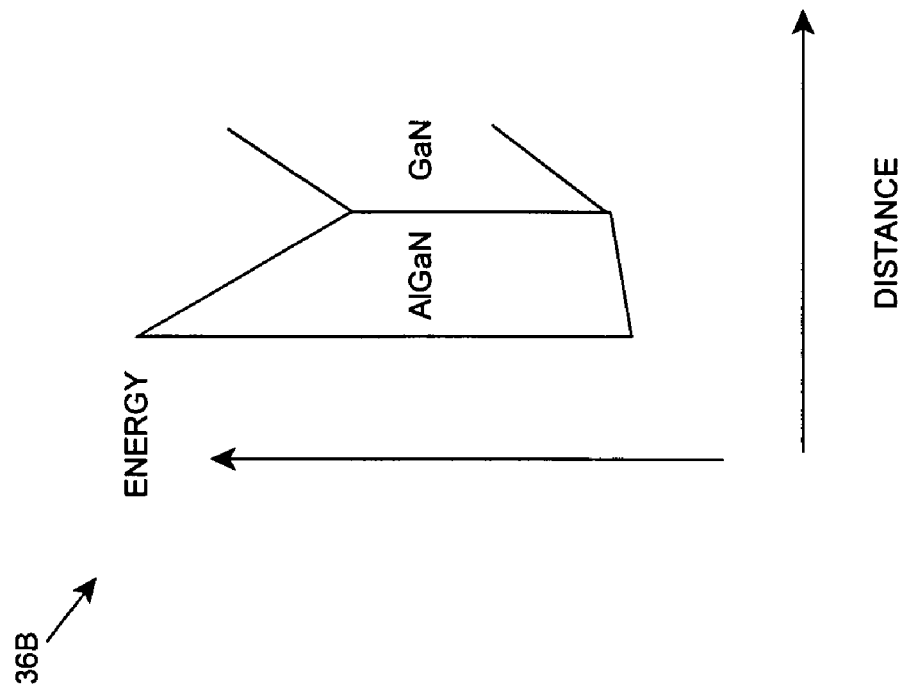
FIGS. 3A-B show illustrative plots of energy versus distance for a barrier layer/quantum well boundary, in which the barrier layer is not graded and graded, respectively.

It is understood that for the purposes of the present disclosure, Al means Aluminum, Be means Beryllium, C means Carbon, Ga means Gallium, In means Indium, Li means Lithium, Mg means Magnesium, Mn means Manganese, N means Nitrogen, O means Oxygen, and Si means Silicon.

As indicated above, the invention provides an improved nitride-based light emitting heterostructure. The nitride-based light emitting heterostructure includes an electron supply layer and a hole supply layer with a light generating structure disposed there between. The light generating structure includes a set of barrier layers, each of which has a graded composition and a set of quantum wells, each of which adjoins at least one barrier layer. Additional features, such as a thickness of each quantum well, can be selected/incorporated into the heterostructure to improve one or more of its characteristics. Further, one or more additional layers that include a graded composition can be included in the heterostructure outside of the light generating structure. The graded composition layer(s) cause electrons to lose energy prior to entering a quantum well in the light generating structure, which enables the electrons to recombine with holes more efficiently in the quantum well. As used herein, unless otherwise noted, the term "set" means one or more.

Turning to the drawings, FIG. 1 shows an illustrative nitride-based light emitting heterostructure 10 according to an embodiment of the invention. Heterostructure 10 is shown including a substrate 12, a buffer layer 14 on substrate 12, and a strain-relieving structure 16 on buffer layer 14. Heterostructure 10 includes an electron supply layer 18, a hole supply layer 22, and a light generating structure 20 disposed between electron supply layer 18 and hole supply layer 22. Heterostructure 10 also is shown including an electron blocking layer 24 disposed between light generating structure 20 and hole supply layer 22, and a contact layer 26.

Substrate 12 can comprise any type of substrate, such as sapphire, silicon carbide (SiC), silicon (Si), GaN, AlGaN, AlON, $LiGaO_2$, and/or the like. Similarly, buffer layer 14 can comprise any type of buffer layer, such as AlN. Further, strain-relieving structure 16 can comprise any type of strain-relieving structure, such as a superlattice (e.g., a long period superlattice, a short period superlattice, a short or long period superlattice comprising graded composition and/or a variable composition from period to period), multiple quantum wells with wide barriers, a single quantum well, a multi-layered structure (e.g., hundreds of Angstroms thick, no confinement) with abrupt or graded heterointerfaces, and/or the like. Strain-relieving structure 16 can comprise any composition, such as AlN/GaN, AlN/AlGaN, AlGaN/AlGaN, AlInGaN/AlInGaN, or the like. Still further, contact layer 26 can comprise any type of contact layer. In one embodiment, contact layer 26 comprises an ohmic contact as shown and described in co-owned, co-pending U.S. patent application Ser. No. 11/208,679, filed on Aug. 22, 2005 and titled "Ohmic Contact for Nitride-Based Semiconductor Device", which is hereby incorporated herein by reference.

Electron supply layer 18 and hole supply layer 22 also can comprise any type of electron/hole supply layers. For example, electron supply layer 18 can comprise an n-type semiconductor, such as an n-type contact layer or an n-type cladding layer. Similarly, hole supply layer 22 can comprise a p-type semiconductor, such as a p-type contact layer or a p-type cladding layer. Further, hole supply layer 22 could comprise a multi-layer structure, such as a Mg-doped AlGaN/GaN or AlGaInN/AlInGaN short period superlattice. Each supply layer 18, 22 can comprise N with one or more of Ga, Al, or In. In one embodiment, electron supply layer 18 comprises an n-type AlGaN cladding layer, and hole supply layer 22 comprises a p-type Mg-doped AlGaN cladding layer. Alternatively, hole supply layer 22 could be doped with Mn, Be, a Mg co-dopant, such as Mg+O, Mg+Si, and/or the like.

Electron blocking layer 24 can comprise any type of electron blocking layer, such as a p-type AlGaN layer. In one embodiment, electron blocking layer 24 comprises a graded composition that provides a gradual transition from a composition for hole supply layer 22 to a composition for electron blocking layer 24. For example, electron blocking layer 24 can comprise an AlGaN composition having a thickness of approximately 500 Angstroms, in which the Al composition is gradually decreased (e.g., approximately linearly) from approximately sixty percent to five percent. It is understood that this is only illustrative of various alternatives. For example, depending on the growth conditions, the fraction of Al in electron blocking layer 24 can either increase or decrease as electron blocking layer 24 moves closer to light generating structure 20. Further, the content of Al can vary between approximately 100% and approximately 0.1%.

FIG. 2 shows an alternative nitride-based light emitting heterostructure 30 according to an embodiment of the invention, in which hole supply layer 22 and electron blocking layer 24 of heterostructure 10 of FIG. 1 are replaced with a graded composition hole supply layer 28. Graded composition hole supply layer 28 can comprise a graded composition that transitions from a hole supply layer composition (e.g., a p-type AlGaN or AlGaInN composition) adjacent to contact layer 26 to an electron blocking layer composition (e.g., a p-type AlGaN composition) as layer 28 moves closer to light generating structure 20. In particular, an amount of Al and/or In in layer 28 can be increased/decreased (e.g., approximately linearly) over the width of layer 28. For example, layer 28 can comprise a thickness of approximately 100 nanometers in which an Al composition increases from approximately 0.1% to approximately 70%.

Returning to FIG. 1, light generating structure 20 includes a set of quantum wells 32 and a set of barrier layers 34. In general, the sets of quantum wells 32 and barrier layers 34 can be alternated such that each quantum well 32 is adjoined by at least one barrier layer 34. It is understood that any number of quantum wells 32 and barrier layers 34 can be included in light generating structure 20, including a single quantum well 32 and barrier layer 34. Each quantum well 32 can comprise any composition, such as AlGaN, AlGaInN, and/or the like. In one embodiment, light generating structure 20 comprises a non-uniform clustering of Al in the AlGaN layers. The non-uniform clustering can improve light emission from light generating structure 20 by adding carrier confinement and/or carrier separation from nonradiative centers. In general, non-uniform clustering of Al refers to nano-scale clusters that comprise a different composition than that of the material surrounding the cluster. Such clusters can be incorporated into one or more quantum well(s) 32 and/or barrier layer(s) 34, depending on a desired wavelength of the light generated by light generating structure 20 and/or a design of a device that incorporates heterostructure 10. For example, the surrounding material may comprise a higher Al composition than that of each cluster. In this case, a potential well is generated that can localize non-equilibrium carriers and prevent them from being captured by other non-radiative centers.

Each barrier layer 34 in light generating structure 20 can comprise a graded composition. The graded composition of each barrier layer 34, electron blocking layer 24, and/or graded composition hole supply layer 28 (FIG. 2) causes electrons to lose energy prior to entering a quantum well 32. In general, a high Al content layer comprises a barrier for electrons and holes. To prevent electron penetration into p-type material, a high Al content layer is used as electron blocking layer 24. However, this will also provide a barrier to holes as they move to the light generating region. In an embodiment of the invention, each barrier layer 34, electron blocking layer 24, and/or graded composition hole supply layer 28 can comprise a ternary or quaternary composition, such as AlGaN, AlGaInN, and/or the like. In one embodiment, each barrier layer 34 comprises ternary or quaternary Al graded composition.

Figure 3B:
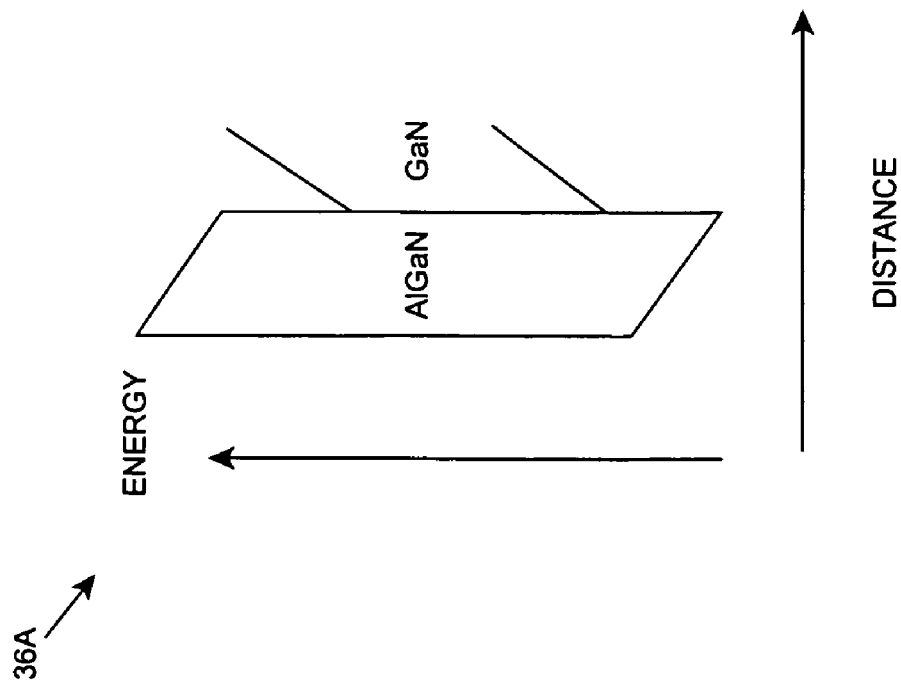

Optimization of graded composition barrier layer 34 can suppress the electron penetration while maintaining good hole injection. For example, FIGS. 3A-B show illustrative plots 36A-B of energy versus distance for an AlGaN barrier layer 34 (FIG. 1)/GaN quantum well 32 (FIG. 1) boundary, in which the AlGaN barrier layer 34 is not graded and graded, respectively. As illustrated in FIG. 3A, the molar fraction of Al in the AlGaN barrier layer 34 is constant, and the boundary includes barriers for both electrons and holes. However, in FIG. 3B, the AlGaN barrier layer 34 has a composition that varies from zero percent Al at the boundary with the GaN quantum well 32 to the same molar fraction of Al as shown in FIG. 3A. In this case, the barrier for electrons increases while the barrier for holes is reduced. This enables the electrons to recombine with holes more efficiently in the quantum well 32.

Figure 4:
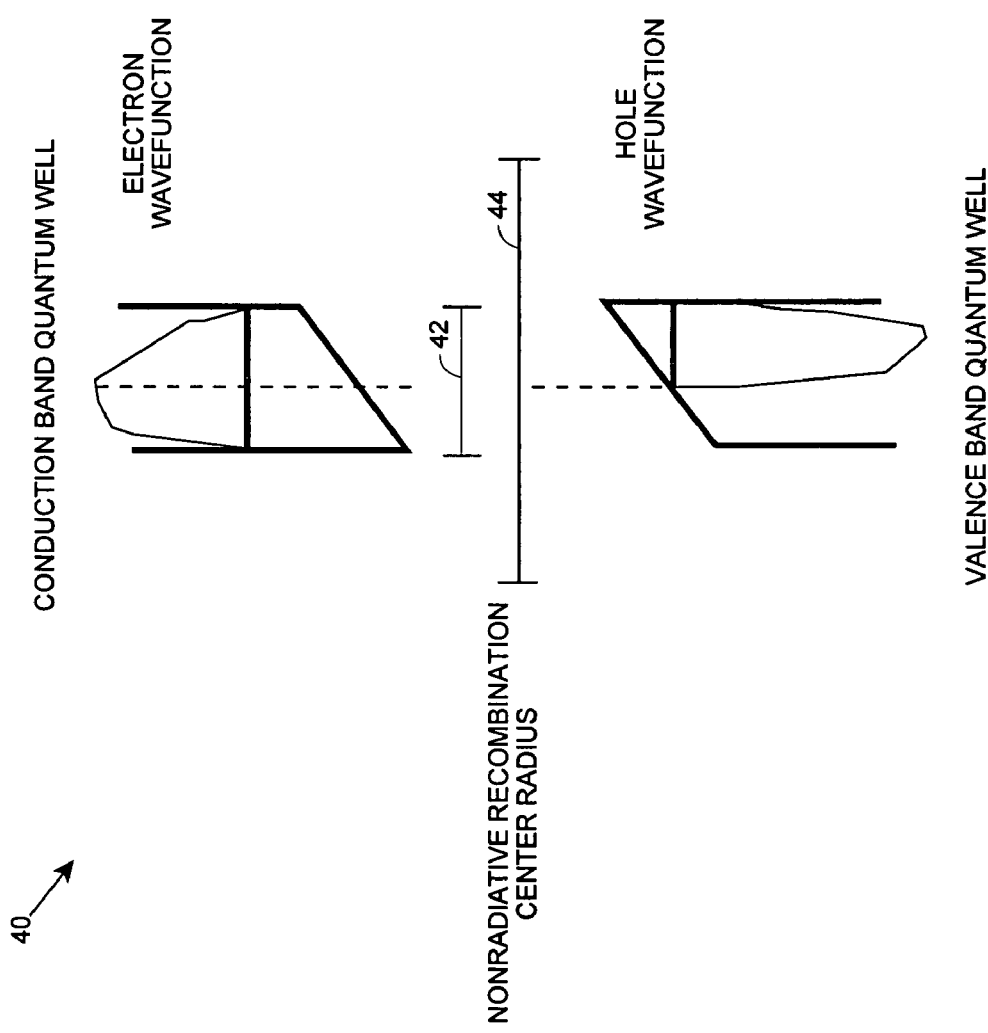
FIG. 4 shows a band diagram of an illustrative quantum well according to an embodiment of the invention.

A thickness (width) of each quantum well 32 in light generating structure 20 can be selected to provide one or more desired operating characteristics. For example, each quantum well 32 can comprise a thickness that is less than a characteristic radius of one or more defects responsible for nonradiative recombination of electrons and holes in quantum well 32. In one embodiment, each quantum well comprises a thickness of approximately two nanometers, which is thinner than the dimension of defects such as dislocation, deep impurity, and/or the like. To this extent, FIG. 4 shows a band diagram 40 of an illustrative quantum well 32, in which a thickness 42 of the quantum well is smaller than a nonradiative recombination center radius 44.

Figure 5A:
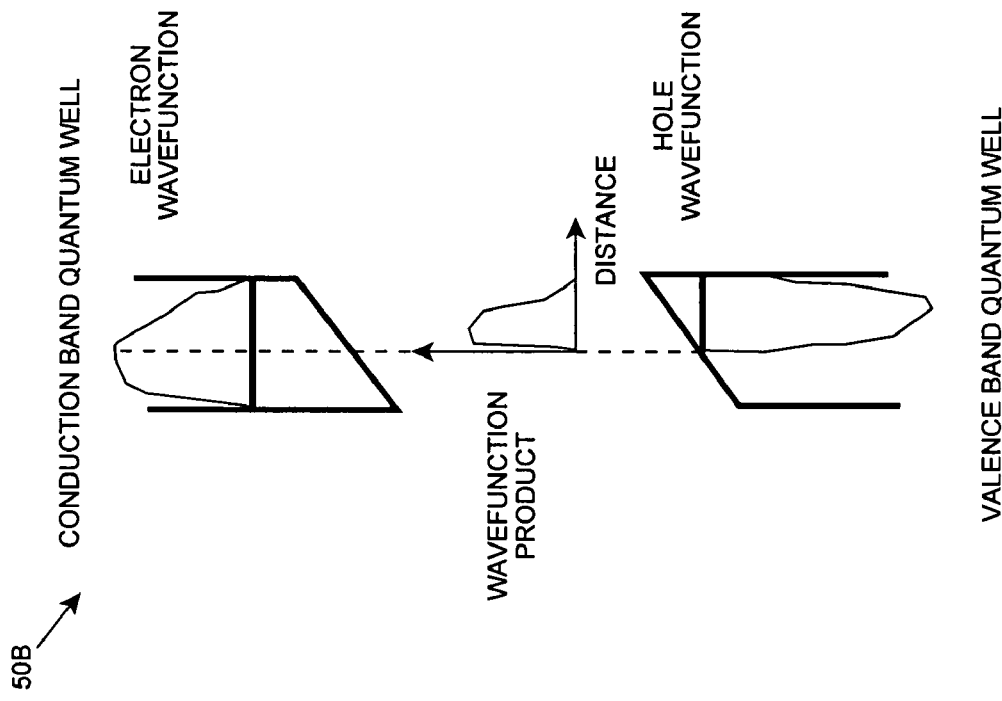
FIGS. 5A-B show illustrative band diagrams of a relatively thick quantum well and a relatively thin quantum well, respectively.
Figure 5B:
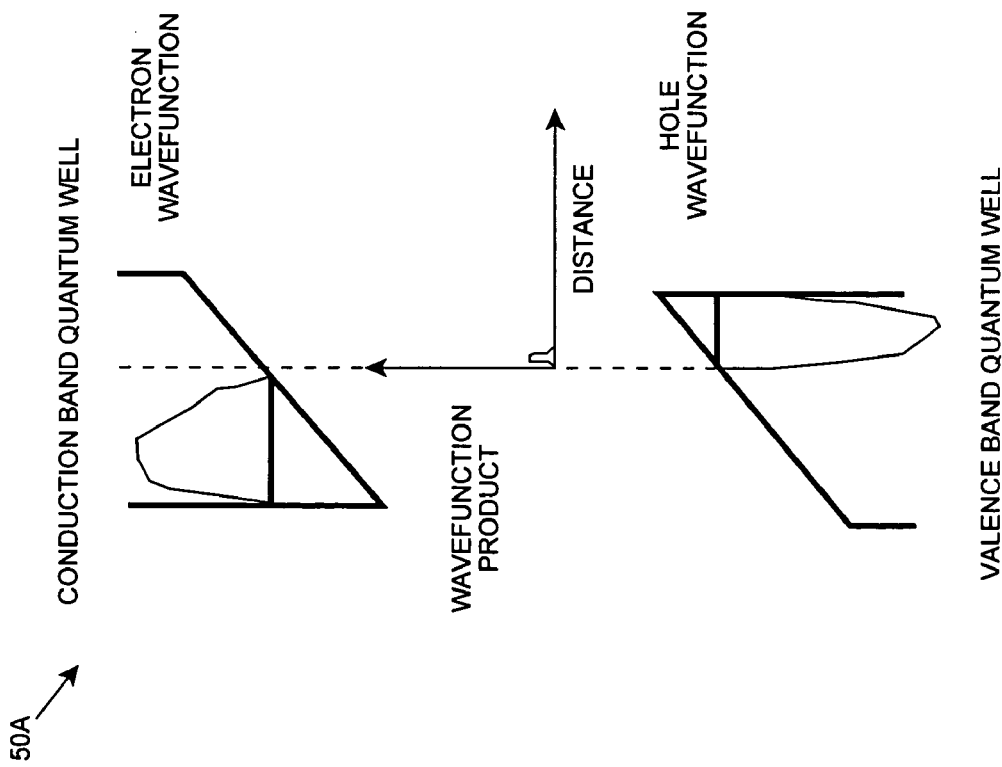

Further, a thickness of each quantum well 32 (FIG. 1) can be selected such that an electron ground state of each quantum well 32 is above a band bending range of energies caused by one or more polarization effects. To this extent, a thickness of each quantum well 32 can generally be in the approximately two to five nanometer range, but in certain cases could be up to approximately ten nanometers. Polarization effects create strong electric fields in quantum well(s) 32. These fields can tilt the band diagram, thereby causing electron-hole separation in real space. For a given polarization field, the thicker the quantum well 32, the larger the band tilt, and the stronger the electron-hole separation. For example, FIGS. 5A-B show illustrative band diagrams 50A-B of a relatively thick quantum well and a relatively thin quantum well, respectively. In FIG. 5A, band diagram 50A illustrates a quantum well in which the electron ground state is within a region of energies affected by a polarization field. In this case, the overlap of the electron and hole wave functions is very small, resulting in a very inefficient light emission. In sharp contrast, FIG. 5B shows a band diagram 50B for a relatively thin quantum well 32, in which the electron ground state is in the region of energies for which the polarization field has little or no effect. In this case, the overlap of the electron and hole wave functions is very large, resulting in a very efficient light emission.

Still further, a thickness of each quantum well 32 (FIG. 1) can be selected to ensure that an electron ground state of each quantum well 32 comprises a higher energy than a highest energy of the bottom of a conduction band in the same quantum well 32. In this case, the electron wavefunction will occupy the entire quantum well, thereby providing a stronger overlap with the hole wavefunction. For example, for a typical polarization field of $F_p=2$ MV/cm (20 meV/nm), the band bending energy is equal to $BB=F_p d$, where d is the thickness of the quantum well. The electron ground state energy can be approximated by:

$$E_O = \frac{\pi^2 \hbar^2}{2 m_e d^2}$$

(it is actually higher due to band bending pushing the ground state up), in which $\hbar$ is the Planck constant, $m_e$ is the electron effective mass (which can be estimated for GaN as 0.228 $m_o$, where $m_o$ is the free electron rest mass). In this case, comparing the band bending and the ground state energy for GaN as a function of d, a width of quantum well 32 should be smaller than approximately 4.5 nanometers to ensure that the electron ground state energy is higher than the band bending energy.

Figure 6:
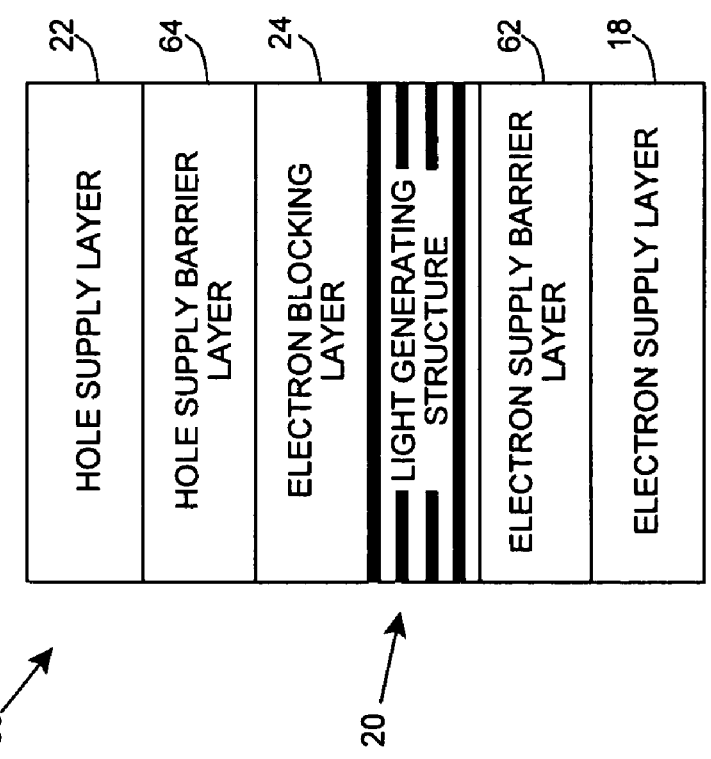
FIG. 6 shows an alternative nitride-based light emitting heterostructure that includes an electron supply barrier layer and a hole supply barrier layer according to an embodiment of the invention.
Figure 8:
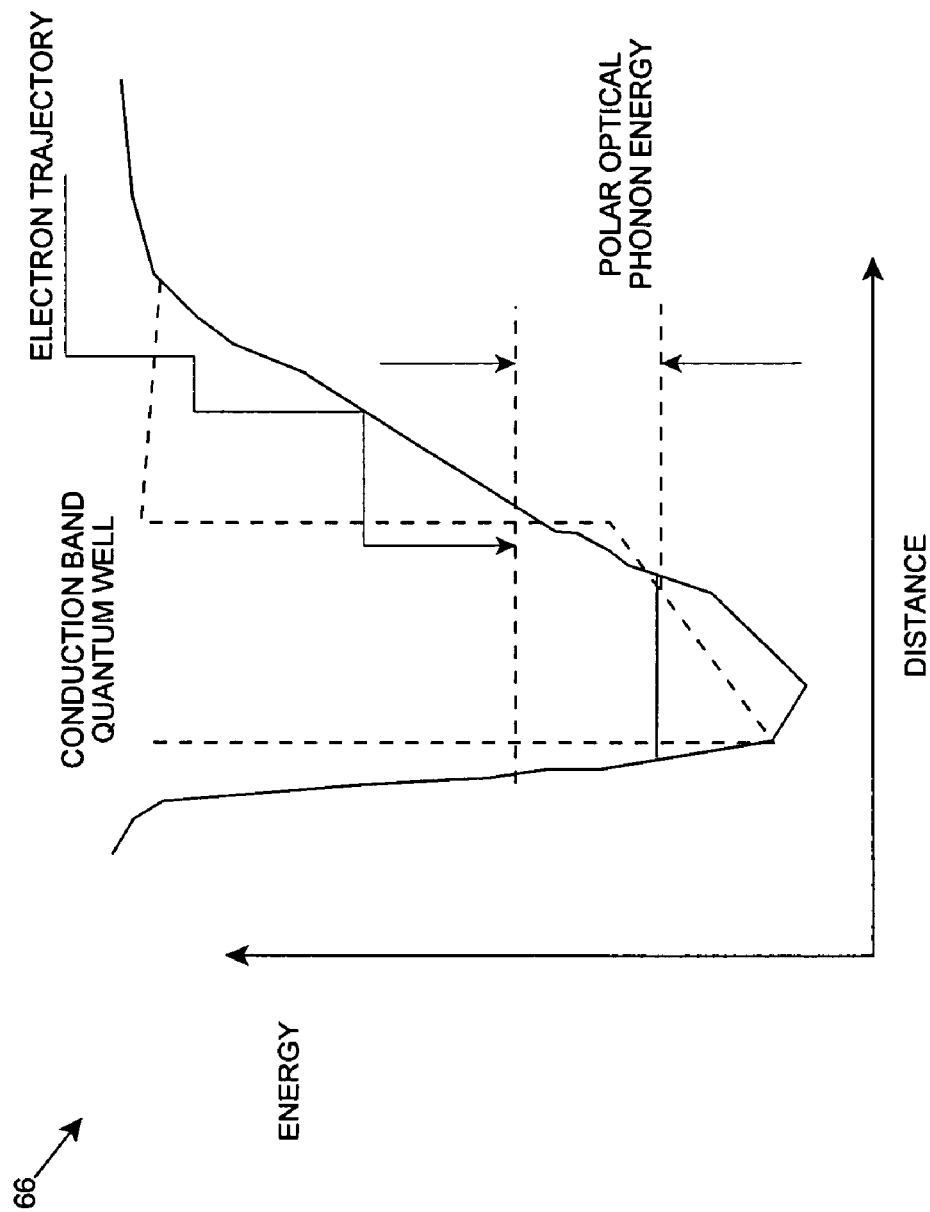
FIG. 8 shows a quantum well having an adjacent electron supply barrier layer according to an embodiment of the invention.

FIG. 6 shows an alternative nitride-based light emitting heterostructure 60 that includes an electron supply barrier layer 62 and a hole supply barrier layer 64 according to an embodiment of the invention. In heterostructure 60, electron supply barrier layer 62 is adjacent to electron supply layer 18 and comprises a graded composition that creates a band structure profile such that electrons entering light generating structure 20 comprise an energy that is approximately the same as an energy of a polar optical phonon. Similarly, hole supply barrier layer 64 is adjacent to hole supply layer 22 and comprises a graded composition that creates a band structure profile such that holes entering light generating structure 20 comprise an energy that is approximately the same as an energy of a polar optical phonon. In this case, the composition difference between light generating structure 20 and electron blocking layer 24 can be tuned to ensure that the holes only see a potential difference of a polar optical phonon. To this extent, FIG. 8 shows a quantum well (in dashed lines) having an adjacent electron supply barrier layer 62 (FIG. 6), which creates a band structure profile such that electrons entering the quantum well have their energy close to the polar optical phonon energy. Further, FIG. 8 shows an illustrative electron trajectory in energy space and an energy of a polar optical phonon. In a nitride layer, the polar optical phonon energy is approximately 90 meV, depending on the composition of the layer. In this case, an electron can comprise an energy that is within a few meV of 90 meV (e.g., approximately 87-93 meV) when it enters the quantum well.

Figure 7:
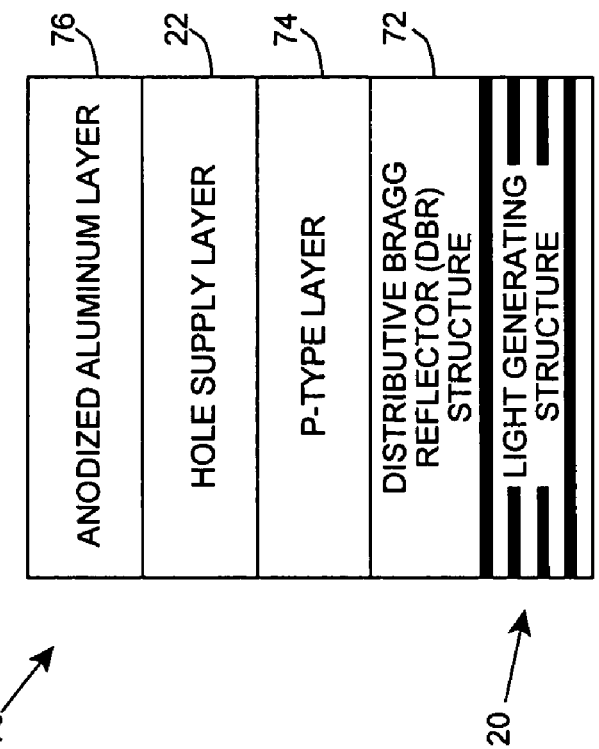
FIG. 7 shows an alternative nitride-based light emitting heterostructure that includes a Distributive Bragg Reflector (DBR) structure and an anodized aluminum layer according to an embodiment of the invention.

FIG. 7 shows an alternative nitride-based light emitting heterostructure 70 that includes a Distributive Bragg Reflector (DBR) structure 72 according to an embodiment of the invention. DBR structure 72 can reflect light of particular wavelength(s), thereby enhancing the output power of heterostructure 70. Further, heterostructure 70 includes a p-type layer 74 over which hole supply layer 22 is disposed. DBR structure 72 and p-type layer 74 each can comprise any composition based on a desired wavelength of the light generated using heterostructure 70. In one embodiment, DBR structure 72 comprises a Mg, Mn, Be, or Mg+Si-doped p-type composition. It is understood that DBR structure 72 could be included in heterostructure 70 without p-type layer 74. Similarly, p-type layer 74 could be included in heterostructure 70 without DBR structure 72. In this case, p-type layer 74 could comprise a p-type AlGaN, AlInGaN. P-type layer 74 could substitute for electron blocking layer 24 (FIG. 1) and/or could be incorporated between hole supply layer 22 and electron blocking layer 24.

Further, heterostructure 70 is shown including an anodized aluminum layer 76 over hole supply layer 22, which can enhance an efficiency with which light is extracted from heterostructure 70. In one embodiment, anodized aluminum layer 76 and hole supply layer 22 comprise a set of holes that form a photonic crystal. Further, hole supply layer 22 can comprise a set of holes, each of which is aligned with a hole in anodized aluminum layer 76. In either case, one or more of the holes can include (e.g., be filled with) a material, such as $SiO_2$, having a different refractive index than a composition of hole supply layer 22.

It is understood that the various heterostructures illustrated and discussed herein are only illustrative of numerous heterostructure configurations that can be implemented under the invention. In particular, under the invention, a heterostructure can include one or more additional layers, one or more fewer layers, and/or the order of layers can be altered based on one or more desired operating characteristics. Further, each layer can be configured to fully or partially cover a lower layer based on the desired operating characteristics and/or device configuration. Additionally, one or more additional device components can be added to heterostructure. To this extent, the invention also provides various types of devices, such as a light emitting device, e.g., a light emitting diode, a laser, and/or the like, which include the heterostructure described herein.

The invention further provides a method of generating each of the heterostructures/devices described herein. In particular, each of the various layers described herein can be formed (e.g., deposited, grown, and/or the like) on an adjacent layer, or an intervening layer, using any solution. For example, referring to FIG. 1, heterostructure 10 can be generated by obtaining substrate 12, forming buffer layer 14 on substrate 12, forming strain-relieving structure 16 on buffer layer 14, forming electron supply layer 18 on strain-relieving structure 16, forming light generating structure 20 on electron supply layer 18 (which can include forming one or more alternating quantum well 32 and barrier layers 34), forming an electron blocking layer 24 on light generating surface 20, forming hole supply layer 22 on electron blocking layer 24, and forming contact layer 26 on electron blocking layer 26. It is understood that each depositing step can include the use of one or more masks and/or the like.

Further, additional processing can be performed to heterostructure (e.g., adding one or more desired components), to generate a device.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A nitride-based light emitting heterostructure comprising:
   an electron supply layer;
   a hole supply layer; and
   a light generating structure disposed between the electron supply layer and the hole supply layer, the light generating structure including:
      a set of barrier layers, each barrier layer comprising a graded composition; and
      a set of quantum wells, each quantum well adjoined by a barrier layer and having a thickness less than a characteristic radius of a defect responsible for nonradiative recombination, wherein the graded composition of each barrier layer causes electrons to lose energy prior to entering a quantum well.

2. The nitride-based light emitting heterostructure of claim 1, wherein a thickness of each quantum well is such that an electron ground state of each quantum well is above a band bending range of energies caused by a set of polarization effects.

3. The nitride-based light emitting heterostructure of claim 1, each barrier layer comprising one of an AlGaN or an AlGaInN composition.

4. The nitride-based light emitting heterostructure of claim 1, further comprising an electron blocking layer disposed between the light generating structure and the hole supply layer.

5. The nitride-based light emitting heterostructure of claim 4, wherein the electron blocking layer comprises a graded composition that transitions from a hole supply layer composition to an electron blocking layer composition.

6. The nitride-based light emitting heterostructure of claim 1, wherein the hole supply layer comprises a graded composition that transitions from a hole supply layer composition to an electron blocking layer composition closer to the light generating structure.

7. The nitride-based light emitting heterostructure of claim 1, further comprising:
   a substrate;
   a buffer layer on the substrate; and
   a strain-relieving structure over the buffer layer.

8. The nitride-based light emitting heterostructure of claim 1, wherein the electron supply layer comprises an n-type contact layer and wherein the hole supply layer comprises a p-type contact layer.

9. The nitride-based light emitting heterostructure of claim 1, further comprising at least one barrier layer adjacent to the electron supply layer, the at least one barrier layer comprising a graded composition that creates a band structure profile such that electrons entering the light generating structure have an energy that is approximately the same as an energy of a polar optical phonon.

10. The nitride-based light emitting heterostructure of claim 1, further comprising at least one barrier layer adjacent to the hole supply layer, the at least one barrier layer comprising a graded composition that creates a band structure profile such that holes entering the light generating structure have an energy that is approximately the same as an energy of a polar optical phonon.

11. The nitride-based light emitting heterostructure of claim 1, wherein the hole supply layer comprises a doped short period superlattice.

12. The nitride-based light emitting heterostructure of claim 1, further comprising a p-type layer disposed between the light generating structure and the hole supply layer.

13. The nitride-based light emitting heterostructure of claim 1, further comprising a Distributive Bragg Reflector (DBR) structure disposed over the light generating structure.

14. The nitride-based light emitting heterostructure of claim 13, wherein the DBR structure comprises a doped p-type composition.

15. The nitride-based light emitting heterostructure of claim 1, further comprising an anodized aluminum layer disposed over the hole supply layer.

16. The nitride-based light emitting heterostructure of claim 15, wherein the hole supply layer and the anodized aluminum layer comprise a plurality of holes that form a photonic crystal.

17. The nitride-based light emitting heterostructure of claim 15, wherein the hole supply layer includes a set of holes, each of which is aligned with a hole in the anodized aluminum layer.

18. The nitride-based light emitting heterostructure of claim 17, wherein at least one of the set of holes includes a material having a different refractive index than a composition of the p-type layer.

19. A nitride-based light emitting device comprising:
   a substrate;
   a buffer layer on the substrate;
   a strain-relieving structure over the buffer layer;
   an electron supply layer over the strain-relieving structure;
   a hole supply layer; and
   a light generating structure disposed between the electron supply layer and the hole supply layer, the light generating structure including:
      a set of barrier layers, each barrier layer comprising a graded composition; and
      a set of quantum wells, each quantum well adjoined by a barrier layer and having a thickness less than a characteristic radius of at least one defect responsible for nonradiative recombination.

20. The nitride-based light emitting device of claim 19, configured to operate as one of a light emitting diode or a laser.

21. The nitride-based light emitting heterostructure of claim 1, wherein each barrier layer has a varying composition of Aluminum that increases a baffler for electrons and reduces a barrier for holes at a boundary with a quantum well as compared to a baffler layer having a constant composition of Aluminum.

* * * * *

UNITED STATES PATENT AND TRADEMARK OFFICE
CERTIFICATE OF CORRECTION

PATENT NO. : 7,326,963 B2 Page 1 of 1
APPLICATION NO. : 11/292519
DATED : February 5, 2008
INVENTOR(S) : Remigijus Gaska et al.

It is certified that error appears in the above-identified patent and that said Letters Patent is hereby corrected as shown below:

Col. 10, Line 52
Claim 19, line 15 - "at least one defect" should be changed to --a defect--;

Col. 10, Line 53
Claim 19, line 16 - "recombination." should be changed to --recombination, wherein the graded composition of each barrier layer causes electrons to lose energy prior to entering a quantum well.--; and Col. 10, Line 59 & 61
Claim 21, lines 3 and 5 - each occurrence of "baffler" should be changed to --barrier--.

Signed and Sealed this

Twentieth Day of May, 2008

JON W. DUDAS
*Director of the United States Patent and Trademark Office*